(12) United States Patent
Then et al.

(10) Patent No.: US 10,573,647 B2
(45) Date of Patent: Feb. 25, 2020

(54) CMOS CIRCUITS USING N-CHANNEL AND P-CHANNEL GALLIUM NITRIDE TRANSISTORS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/519,277

(22) PCT Filed: Nov. 18, 2014

(86) PCT No.: PCT/US2014/066115
§ 371 (c)(1),
(2) Date: Apr. 14, 2017

(87) PCT Pub. No.: WO2016/080961
PCT Pub. Date: May 26, 2016

(65) Prior Publication Data
US 2017/0243866 A1    Aug. 24, 2017

(51) Int. Cl.
*H01L 27/092* (2006.01)
*H01L 21/8252* (2006.01)
(Continued)

(52) U.S. Cl.
CPC ........ *H01L 27/092* (2013.01); *H01L 21/8252* (2013.01); *H01L 27/0605* (2013.01);
(Continued)

(58) Field of Classification Search
CPC combination set(s) only.
See application file for complete search history.

(56) References Cited

U.S. PATENT DOCUMENTS 5,367,183 A * 11/1994 Perea .................. H01L 27/0605
257/194
5,847,419 A    12/1998 Imai et al.
(Continued)

FOREIGN PATENT DOCUMENTS

EP          1054442          11/2000
JP       62-040778 A          2/1987
(Continued)

OTHER PUBLICATIONS

Extended European Search Report for European Patent Application No. 14906448.7, dated Jun. 8, 2018, 10 pgs.
(Continued)

*Primary Examiner* — Fazli Erdem
(74) *Attorney, Agent, or Firm* — Green, Howard & Mughal LLP

(57) ABSTRACT

CMOS circuits may formed using p-channel gallium nitride transistors and n-channel gallium nitride transistors, wherein both the p-channel gallium nitride transistors and the n-channel gallium nitride transistors are formed on a single layered structure comprising a polarization layer deposited on a first gallium nitride layer and a second gallium nitride layer deposited on the polarization layer. Having both n-channel gallium nitride transistors and p-channel gallium nitride transistors s on the same layer structure may enable "all gallium nitride transistor" implementations of circuits including logic, digital, and analog circuitries spanning low supply voltages to high supply voltages.

25 Claims, 13 Drawing Sheets

(51) Int. Cl.
*H01L 27/06* (2006.01)
*H01L 29/06* (2006.01)
*H01L 29/20* (2006.01)
*H01L 29/778* (2006.01)

(52) U.S. Cl.
CPC ...... *H01L 29/0657* (2013.01); *H01L 29/2003* (2013.01); *H01L 29/7786* (2013.01)

(56) References Cited

U.S. PATENT DOCUMENTS

| | | |
|---|---|---|
| 6,121,153 A | 9/2000 | Kikkawa |
| 6,225,196 B1 | 5/2001 | Yokoyama |
| 6,261,929 B1 | 7/2001 | Gehrke et al. |
| 6,608,327 B1 | 8/2003 | Davis et al. |
| 6,617,668 B1 | 9/2003 | Koide et al. |
| 7,952,150 B1 | 5/2011 | Wohlmuth |
| 8,173,551 B2 | 5/2012 | Bai et al. |
| 8,383,471 B1 | 2/2013 | Shinihara et al. |
| 8,530,978 B1 | 9/2013 | Chu et al. |
| 8,629,477 B2 | 1/2014 | Lochtefeld et al. |
| 8,772,786 B2 | 7/2014 | Tabatabaie et al. |
| 8,836,016 B2 | 9/2014 | Wu et al. |
| 9,117,777 B2 | 8/2015 | Vincent et al. |
| 9,153,583 B2 | 10/2015 | Glass et al. |
| 9,196,709 B2 | 11/2015 | Lee et al. |
| 9,240,410 B2 | 1/2016 | Then et al. |
| 2001/0040246 A1 | 11/2001 | Ishii |
| 2002/0110989 A1 | 8/2002 | Yamaguchi et al. |
| 2002/0152952 A1 | 10/2002 | Beaumont |
| 2003/0045017 A1 | 3/2003 | Hiramatsu et al. |
| 2004/0029365 A1 | 2/2004 | Linthicum et al. |
| 2004/0169192 A1 | 9/2004 | Kato et al. |
| 2006/0084245 A1 | 4/2006 | Khoda |
| 2006/0124962 A1 | 6/2006 | Ueda et al. |
| 2006/0181828 A1 | 8/2006 | Sato |
| 2006/0197129 A1 | 9/2006 | Wohlmuth |
| 2007/0045670 A1 | 3/2007 | Kuraguchi |
| 2007/0278507 A1 | 12/2007 | Nakazawa et al. |
| 2008/0036038 A1 | 2/2008 | Hersee et al. |
| 2008/0070355 A1 | 3/2008 | Lochtefeld et al. |
| 2008/0093622 A1 | 4/2008 | Li |
| 2008/0099785 A1 | 5/2008 | Bai |
| 2008/0197358 A1 | 8/2008 | Frahm et al. |
| 2009/0039361 A1 | 2/2009 | Li |
| 2009/0267078 A1 | 10/2009 | Mishra et al. |
| 2010/0012976 A1 | 1/2010 | Hydrick et al. |
| 2010/0012977 A1 | 1/2010 | Derluyn et al. |
| 2010/0068866 A1 | 3/2010 | Yu et al. |
| 2010/0072576 A1 | 3/2010 | Arena |
| 2010/0140735 A1 | 6/2010 | Bommena et al. |
| 2010/0207138 A1 | 8/2010 | Nakahata et al. |
| 2010/0213511 A1 | 8/2010 | Lochtefeld |
| 2010/0219452 A1 | 9/2010 | Brierley |
| 2010/0270559 A1 | 10/2010 | Ota |
| 2011/0079822 A1 | 4/2011 | Kanamura |
| 2011/0117726 A1 | 5/2011 | Pinnington et al. |
| 2011/0210377 A1* | 9/2011 | Haeberlen ............ H01L 29/2003 257/194 |
| 2011/0272740 A1* | 11/2011 | Umeda ............... H01L 29/1066 257/192 |
| 2011/0278945 A1 | 11/2011 | Wheatley, III et al. |
| 2011/0284865 A1 | 11/2011 | Inoue et al. |
| 2012/0119218 A1 | 5/2012 | Su et al. |
| 2012/0119220 A1 | 5/2012 | Guo et al. |
| 2012/0248500 A1 | 10/2012 | Kajitani |
| 2012/0292789 A1 | 11/2012 | Sazawa |
| 2012/0305992 A1 | 12/2012 | Marino et al. |
| 2013/0015460 A1* | 1/2013 | Chen ................ H01L 21/28575 257/76 |
| 2013/0015525 A1 | 1/2013 | Cheng |
| 2013/0043468 A1 | 2/2013 | Adekore |
| 2013/0043485 A1* | 2/2013 | Ueno ................ H01L 29/42316 257/76 |
| 2013/0049013 A1 | 2/2013 | Shimada |
| 2013/0105808 A1 | 5/2013 | Wong et al. |
| 2013/0105810 A1 | 5/2013 | Nishimori et al. |
| 2013/0221409 A1* | 8/2013 | Nakajima ............ H01L 27/095 257/194 |
| 2013/0228809 A1 | 9/2013 | Chang et al. |
| 2013/0256679 A1 | 10/2013 | Yao et al. |
| 2013/0270579 A1 | 10/2013 | Yu et al. |
| 2013/0271208 A1 | 10/2013 | Then et al. |
| 2013/0277686 A1 | 10/2013 | Liu et al. |
| 2013/0307513 A1 | 11/2013 | Then et al. |
| 2013/0313561 A1* | 11/2013 | Suh ........ H01L 29/402 257/76 |
| 2013/0320353 A1 | 12/2013 | Kryiouk et al. |
| 2013/0334538 A1 | 12/2013 | Saunier |
| 2014/0014966 A1 | 1/2014 | Tabatabaie et al. |
| 2014/0042446 A1 | 2/2014 | Chiang |
| 2014/0084300 A1 | 3/2014 | Okamoto |
| 2014/0091308 A1 | 4/2014 | Dasgupta et al. |
| 2014/0091310 A1* | 4/2014 | Jeon ............ H01L 29/2003 257/76 |
| 2014/0091398 A1 | 4/2014 | Hata et al. |
| 2014/0091845 A1 | 4/2014 | Then et al. |
| 2014/0094223 A1 | 4/2014 | Dasgupta et al. |
| 2014/0110759 A1 | 4/2014 | Murata et al. |
| 2014/0239312 A1 | 8/2014 | Shatalov et al. |
| 2014/0252368 A1* | 9/2014 | Lee ............ H01L 29/66462 257/76 |
| 2014/0264321 A1 | 9/2014 | Liang |
| 2014/0264379 A1* | 9/2014 | Kub ............ H01L 29/41725 257/77 |
| 2014/0264380 A1* | 9/2014 | Kub ............ H01L 29/41725 257/77 |
| 2015/0041820 A1* | 2/2015 | Renaud ............ H01L 29/778 257/76 |
| 2015/0041860 A1 | 2/2015 | Nishimori et al. |
| 2015/0061075 A1 | 3/2015 | Yeh |
| 2015/0061078 A1 | 3/2015 | Abel et al. |
| 2015/0103977 A1 | 4/2015 | Ono et al. |
| 2015/0115325 A1* | 4/2015 | Vielemeyer ......... H01L 29/7802 257/194 |
| 2015/0144957 A1 | 5/2015 | Lu et al. |
| 2015/0206796 A1 | 7/2015 | Dasgupta et al. |
| 2015/0263223 A1 | 9/2015 | Ito |
| 2015/0318276 A1 | 11/2015 | Bayram et al. |
| 2015/0340482 A1 | 11/2015 | Padmanabhan et al. |
| 2016/0111496 A1 | 4/2016 | Leobandung |
| 2016/0336437 A1 | 11/2016 | Kajitani et al. |
| 2017/0221999 A1 | 8/2017 | Dasgupta |
| 2017/0278959 A1* | 9/2017 | Then ................ H01L 29/66462 |
| 2018/0175184 A1 | 6/2018 | Then et al. |

FOREIGN PATENT DOCUMENTS

| | | |
|---|---|---|
| JP | 11260835 | 9/1999 |
| JP | 2001230410 | 8/2001 |
| JP | 2002249400 | 9/2002 |
| JP | 200369010 | 3/2003 |
| JP | 2007165431 | 6/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2014078653 | 5/2014 |
| JP | 2014131028 | 7/2014 |
| JP | 2014192167 | 7/2016 |
| KR | 10-2012-0048244 A | 5/2012 |
| KR | 10-2013-0046249 A | 5/2013 |
| KR | 101410092 | 6/2014 |
| TW | 201415626 | 4/2014 |
| WO | 2011064997 | 6/2011 |

(56) References Cited

FOREIGN PATENT DOCUMENTS

| WO | 2015047355 | 4/2015 |
|---|---|---|
| WO | 2016209263 | 12/2016 |

OTHER PUBLICATIONS

Extended European Search Report from European Patent Application No. 14905255.7 dated May 16, 2018, 9 pgs.
Extended European Search Report from European Patent Application No. 14908596.1 dated Aug. 13, 2018, 8 pgs.
International Preliminary Report on Patentability from PCT/US2014/071163 dated Jun. 29, 2017, 3 pgs.
Non-Final Office Action from Japanese Patent Application No. 2017-514622 dated Jun. 26, 2018, 10 pgs.
Non-Final Office Action from U.S. Appl. No. 15/511,139 dated Dec. 1, 2017, 11 pgs.
Notice of Allowance from U.S. Appl. No. 15/511,139 dated May 7, 2018, 8 pgs.
Notice of Allowance from U.S. Appl. No. 15/526,735 dated Apr. 30, 2018, 9 pgs.
Restriction Requirement for U.S. Appl. No. 15/511,139, dated Aug. 29, 2017.
Guo, Jia et al., "MBE-Regrown Ohmics in InAlN HEMTs With a Regrowth Interface Resistance of 0.05Ω * mm", IEEE Electron Device Letters, vol. 33, No. 4, Apr. 2012, 3 pgs.
Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.
Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.
International Preliminary Report on Patentability and Written Opinion received for PCT Patent Application No. PCT/US2014/063140, dated May 11, 2017, 9 pages.
International Search Report and Written Opinion received for PCT Patent Application No. PCT/US2014/063140, dated Jul. 13, 2015, 12 pages.
International Search Report and Written Opinion received for PCT Patent Application No. PCT/US2014/066115, dated Jul. 31, 2015, 12 pages.
International Preliminary Report on Patentability and Written Opinion received for PCT Patent Application No. PCT/US2014/066115, dated Jun. 1, 2017, 9 pages.
International Search Report and Written Opinion received for PCT Patent Application No. PCT/US2014/071163, dated Sep. 17, 2015, 13 pages.
Office Action and Search Report dated Jan. 11, 2019 for Taiwan Patent Application No. 104133384.
Katona, T.M. et al., "Control of crystallographic tilt in GaN grown on Si (111) by cantilever epitaxy", Applied Physics Letters, vol. 81, No. 19, Nov. 4, 2002, 3 pgs.
Masui, Hisashi et al., "Geometrical Characteristics and Surface Polarity of Inclined Crystallographic Plane of the Wurzite and Zincblende Structures", Journal of Electronic Materials, vol. 38, No. 6, 2009.
Wan, J. et al., "Growth of Crack-Free Hexagonal GaN Films on Si (100)", Applied Physics Letters, USA, Jul. 18, 2001, Vo. 79, No. 10. p. 1459-1460, DOI: 10.1063/1.1400770.
Office Action dated Jun. 26, 2019 for Taiwan Patent Application No. 105111385. No translation.

* cited by examiner

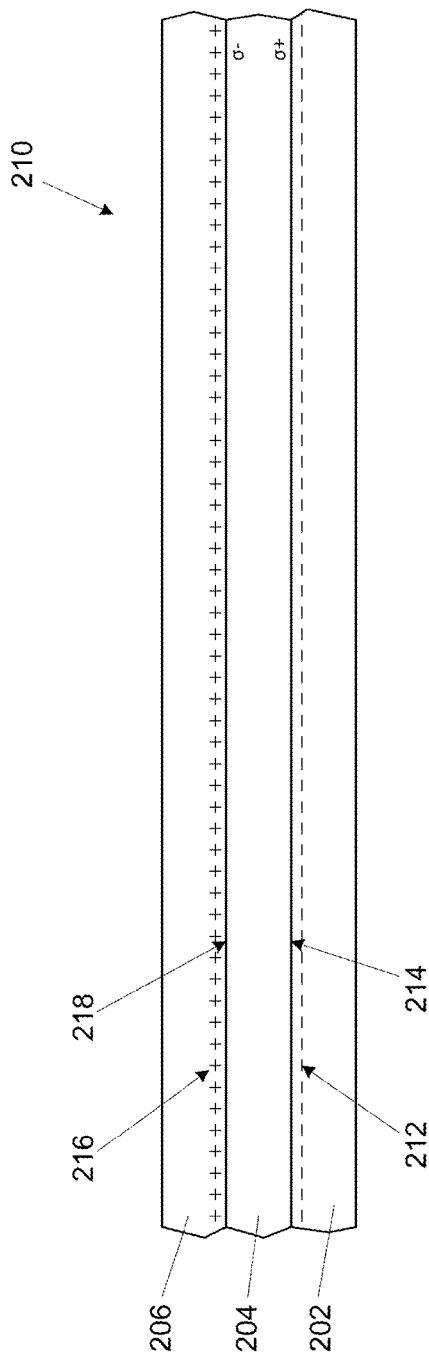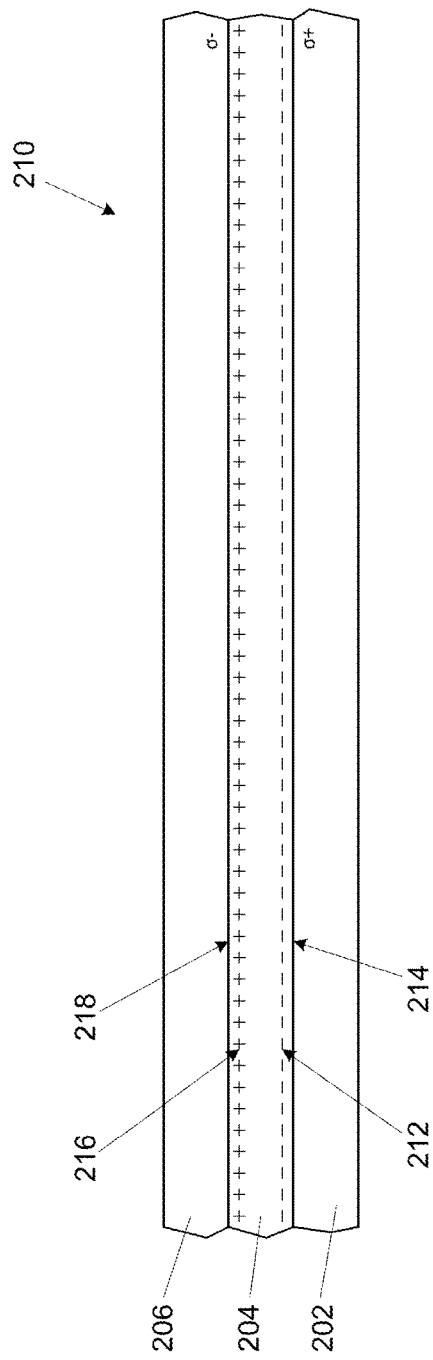

CMOS CIRCUITS USING N-CHANNEL AND P-CHANNEL GALLIUM NITRIDE TRANSISTORS

RELATED APPLICATION

The present application is a national stage entry of PCT Patent Application No. PCT/US2014/066115, filed on Nov. 18, 2014, entitled "CMOS CIRCUITS USING N-CHANNEL AND P-CHANNEL GALLIUM NITRIDE TRANSISTORS", which is hereby incorporated herein by reference in its entirety and for all purposes.

TECHNICAL FIELD

Embodiments of the present description generally relate to the field of microelectronic devices, and, more particularly, to forming CMOS (Complementary Metal Oxide Semiconductor) circuits and structures using both n-channel and p-channel gallium nitride transistors.

BACKGROUND

The microelectronics industry is continually striving to produce ever faster and smaller microelectronic packages for use in various electronic products, including, but not limited to, computer server products and portable products, such as laptop/netbook computers, electronic tablets, smart phones, digital cameras, and the like. One route to achieve these goals is the fabrication of System-on-Chip (SoC) devices, wherein all of the components of an electronic system are fabricated on a single chip. In such SoC devices, power management integrated circuits (PMIC) and radio frequency integrated circuits (RFIC) are critical functional blocks, and are as important as logic and memory integrated circuits in determining the power efficiency and the form factor of such SoC devices. Therefore, there is an ongoing effort to scaled down and/or improve the efficiency of PMICs and RFICs, as well as logic and memory integrated circuits, for SoC devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 3-9 are side cross-section views of the fabrication of a gallium nitride circuit structure, according to one embodiment of the present description.

DESCRIPTION OF EMBODIMENTS

Figure 1:
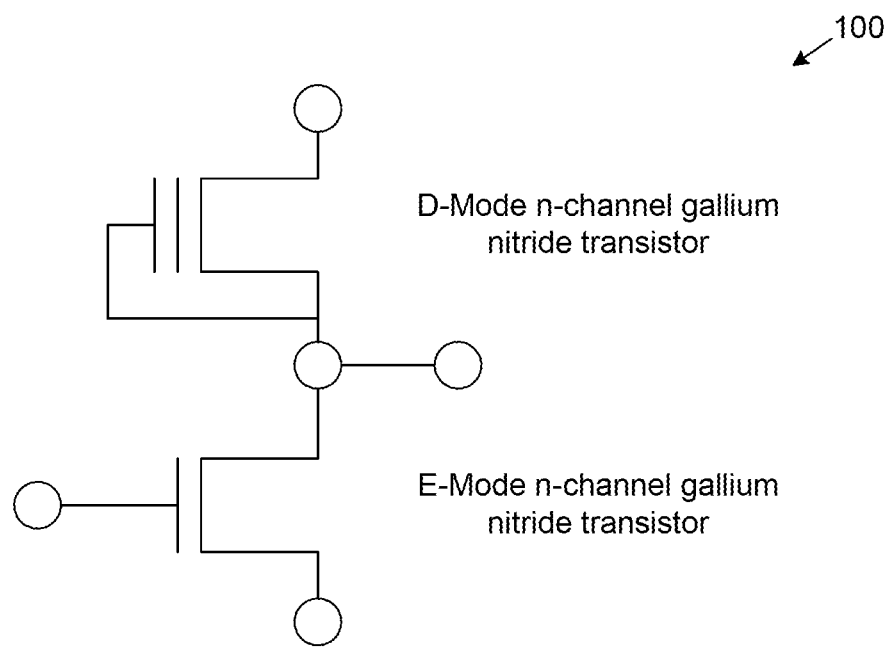
FIG. 1 is a schematic of a gallium nitride circuit, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description related to CMOS circuits formed using p-channel gallium nitride transistors and n-channel gallium nitride transistors, wherein both the p-channel gallium nitride transistors and the n-channel gallium nitride transistors are formed on a single layered structure comprising a polarization layer deposited on a first gallium nitride layer and a second gallium nitride layer deposited on the polarization layer. Having both n-channel gallium nitride transistors and p-channel gallium nitride transistors on the same layer structure may enable "all gallium nitride transistor" implementations of circuits including logic, digital, and analog circuitries spanning low supply voltages to high supply voltages.

Gallium nitride has a relatively wide bandgap (e.g. about 3.4 eV), when compared to the bandgap of silicon (about 1.1 eV). Therefore, gallium nitride transistors may withstand large electric fields, such as applied voltages, drain voltage, and the like, before suffering breakdown, when compared to a silicon based transistor of similar dimensions. This also enables the gallium nitride transistors to be scaled to even smaller physical dimensions when operating at the same supply voltage to a comparable silicon based transistor.

Gallium nitride has a high electronic mobility (e.g. about 1000 cm$^2$/Vs) which makes it a very good material for the formation of an n-channel gallium nitride transistor, as an n-channel gallium nitride transistor employs a 2D electron gas as its transportation channel. Gallium nitride has a hole mobility (zero strain) which is an order of magnitude weaker (e.g. about 100 cm$^2$/Vs) than its electronic mobility. However, it still is a good material for the formation of a p-channel gallium nitride transistor, as a p-channel gallium nitride transistor employs a 2D hole gas as its transportation channel, since is hole mobility is still comparable to unstrained silicon hole mobility.

Figure 2:
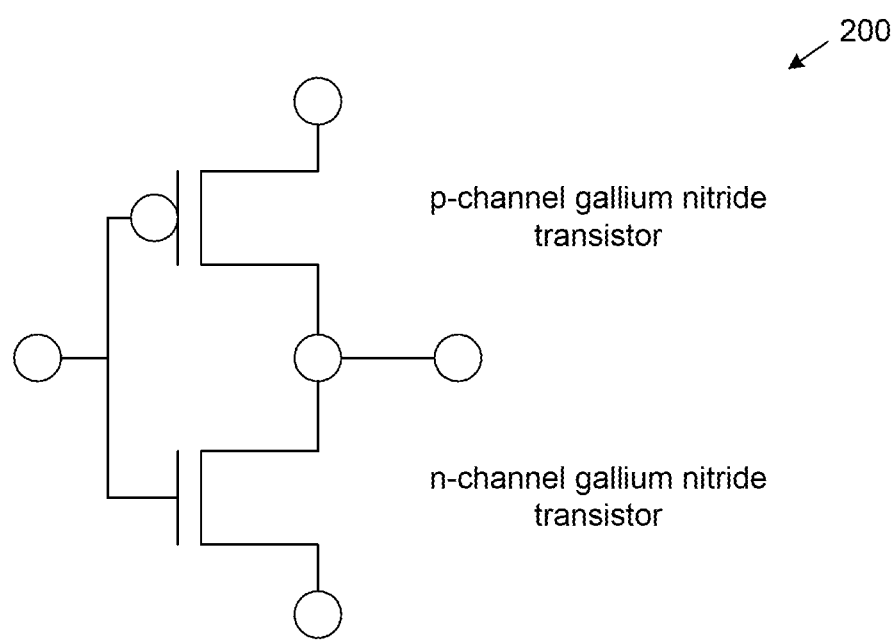
FIG. 2 is a schematic of a gallium nitride circuit, according to an embodiment of the present description.

As shown in FIG. 1, a gallium nitride circuit 100, such as a logic or control circuit, is commonly implemented using a depletion mode n-channel gallium nitride transistor in conjunction with an enhancement mode n-channel gallium nitride transistor. However, steady-state leakage may be high in such circuits due to the depletion mode n-channel nitride transistor acting as a resistor, as will be understood to those skilled in the art. A CMOS gallium nitride circuit 200 of embodiments of the present description may comprise the depletion mode n-channel gallium nitride transistor of FIG. 1 being replaced with a p-channel gallium nitride transistor, as shown in FIG. 2.

FIGS. 3-9 illustrate a method of fabricating a gallium nitride circuit structure, according to one embodiment of the present description. As shown in FIG. 3, a layered structure 210 may be formed with a polarization layer 204 deposited on a first gallium nitride layer 202 and a second gallium nitride layer 206 deposited on the polarization layer 204 with the polarization layer 204 comprising aluminum gallium nitride, aluminum indium nitride, aluminum indium gallium nitride, aluminum nitride, and like materials. The polarization layer 204 may have ternary crystal structure which forms a 2D electron gas 212 (designated generically with negative "−" symbols) in the first gallium nitride layer 202 due to the formation of an abrupt hetero junction interface 214 between the first gallium nitride layer 202 and the polarization layer 204 through spontaneous and piezoelectric polarization, as will be understood to those skilled in the art. In a like manner, the deposition of the second gallium nitride layer 206 on the polarization layer 204 forms a 2D hole gas 216 (designated generically with positive "+" symbols) within the second gallium nitride layer 206 proximate an interface 218 between the second gallium nitride layer 206 and the polarization layer 204. The 2D hole gas 216 forms due to the formation of the 2D electron gas 212 which shifts the polarization layer 204 positive (labeled as "σ+") near the first gallium nitride layer 202, thereby shifting the polarization layer 204 negative (labeled as "σ−") near the second gallium nitride layer 206. Very high charge densities up to about 2E13 per cm$^2$ can be formed by such mechanisms, without the use of impurity dopants, which allows for high mobilities to be preserved, as will be understood to those skilled in the art. The polarization layer 204 may also act as electrical insulation between the 2D electron gas 212 and the 2D hole gas 216, which is achieved by both conduction and valence bonds offsets, as well as, by the built-in polarization field, as will be understood to those skilled in the art.

As shown in FIG. 4, the layered structure 210 formed with a polarization layer 204 deposited on a first gallium nitride layer 202 and a second gallium nitride layer 206 deposited on the polarization layer 204 is illustrated with the polarization layer 204 being indium gallium nitride and like materials. When the polarization layer 204 is indium gallium nitride and like materials, the 2D electron gas 212 forms in the polarization layer 204, as will be understood to those skilled in the art. In a like manner, the deposition of the second gallium nitride layer 206 on the polarization layer 204 forms the 2D hole gas 216 within the polarization layer 204. Again, the polarization layer 204 may also act as electrical insulation between the 2D electron gas 212 and the 2D hole gas 216, which, in the embodiment of the polarization layer 204 being indium gallium nitride and like materials, is achieved by the built-in polarization field alone. Additionally, although the 2D electron gas 212 and the 2D hole gas 216 are formed in different locations in this embodiment from that shown in FIG. 3, the same results and mechanisms are achieved. Thus, for the sake of conciseness and brevity, FIGS. 5-9 will illustrate the 2D electron gas 212 and the 2D hole gas 216 locations of FIG. 3.

Figure 5:
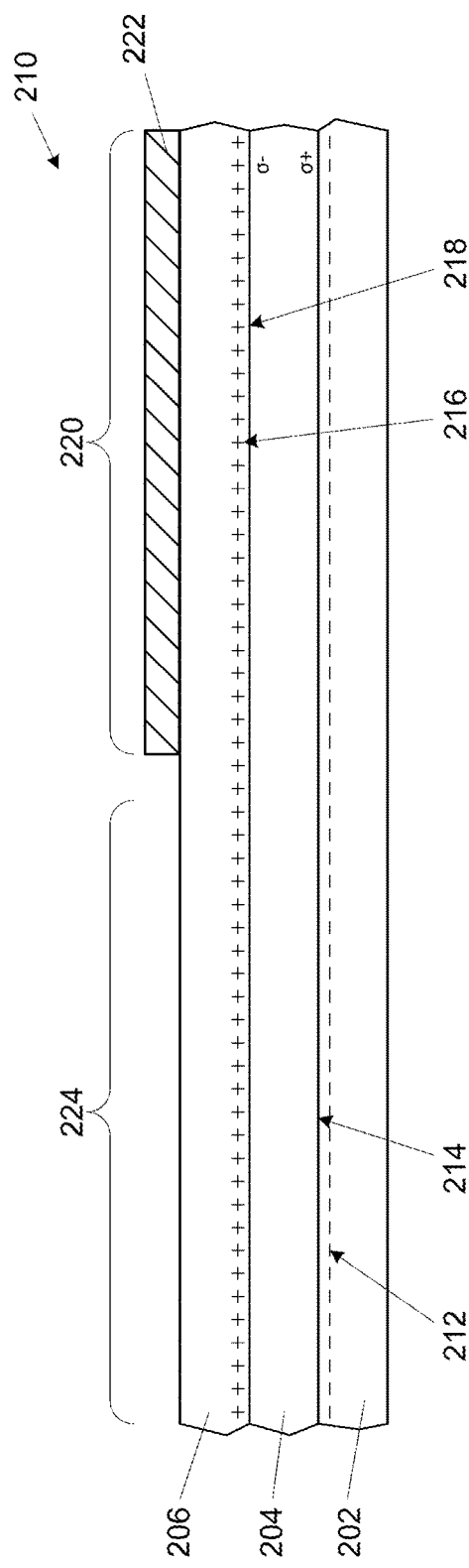
Figure 6:
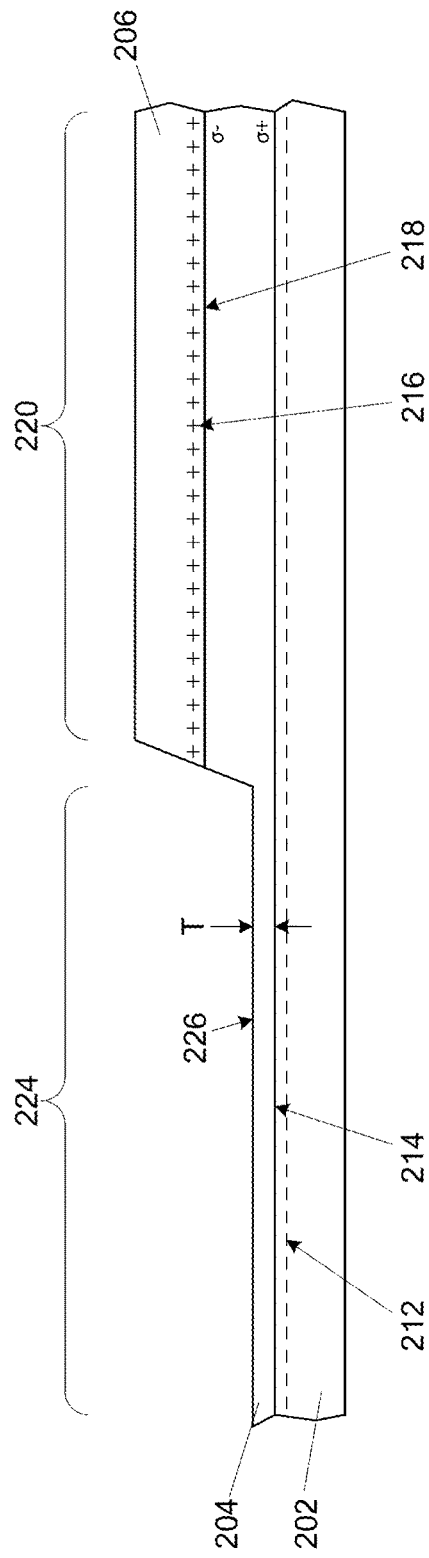

As shown in FIG. 5, a portion 220 of the layered structure 210 designated for the subsequent formation of a p-channel gallium nitride transistor may be patterned with a hardmask 222, such as silicon nitride. As shown in FIG. 6, the second gallium nitride layer 206 in the unmasked portion 224 designated for the subsequent formation of an n-channel gallium nitride circuit structure may be remove, such as by etching, and a portion of the polarization layer 204 may be removed, such as by etching, to form a polarization layer intermediate surface 226, such that the polarization layer intermediate surface 226, from a planar standpoint, is between the interface 214 between the first gallium nitride layer 202 and the polarization layer 204 and the remaining interface 218 between the second gallium nitride layer 206 and the polarization layer 204. In one embodiment, a thickness T between the intermediate surface 226 and the interface 214 between the first gallium nitride layer 202 and the polarization layer 204 may be less than about 20 nm.

Figure 7:
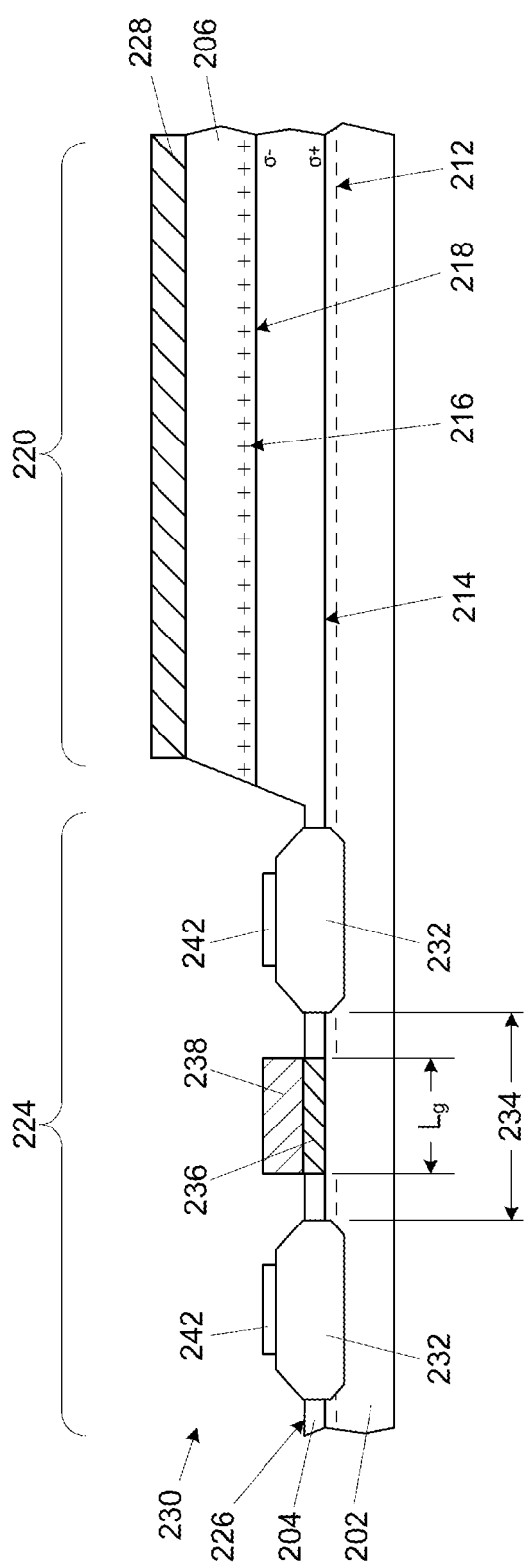

As illustrated in FIG. 7, an n-channel gallium nitride transistor 230 may be formed in the portion 224 after a second hardmask 228 is patterned on the portion 220 designated for the subsequent formation of a p-channel gallium nitride circuit structure. The n-channel gallium nitride transistor 230 may comprise opposing source/drain structures 232 (one being a source structure and the other being a drain structure) with a gate region 234 defined therebetween. A gate dielectric 236 may be formed in the gate region 234 and a gate electrode 238 may be formed on the gate dielectric 236, such that the gate dielectric 236 electrically isolates the gate electrode 238. In one embodiment, the n-channel gallium nitride transistor 230 is an enhancement mode transistor. Thus, as shown, a portion of the polarization layer 204 may be removed to disrupt the 2D electron gas 212, such that it does not extend through the gate length $L_g$ of the n-channel gallium nitride transistor 230 to achieve enhancement mode operation.

In one embodiment, the source/drain structures 232 may be formed by forming by patterning a hardmask (not shown), such as silicon nitride, silicon oxide, and the like, on the polarization layer intermediate surface and recesses (not shown) may be formed to extend through the polarization layer 204 and into the first gallium nitride layer 202, by any known technique, such as etching. In one embodiment, the recesses (not shown) may be formed with a plasma etch in a chlorine based chemistry. The source/drain structures 232, such as comprising N+ indium gallium nitride, N+ gallium nitride, N+ indium nitride, and any graded combination thereof, may be formed in the recesses (not shown) by epitaxial regrowth from the first gallium nitride layer 202. In one embodiment, the regrowth process may comprise epitaxial crystal growth techniques, such as metal organic chemical vapor deposition (MOCVD) or molecular beam epitaxy (MBE). After the formation of the source/drain structures 232, metallizations 242 may be formed on the source/drain structures 232.

The gate dielectric 236 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate. The gate dielectric 236 can be formed by well-known techniques, such as chemical vapor deposition ("CVD"), physical vapor deposition ("PVD"), and atomic layer deposition ("ALD"). The gate electrode 238 can be formed of any suitable gate electrode material. In an embodiment of the present disclosure, the gate electrode 238 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 238 can be formed by well-known techniques, such as by blanket depositing a gate electrode material and then patterning the gate electrode material with well-known photolithography and etching techniques, as will be understood to those skilled in the art.

Figure 8:
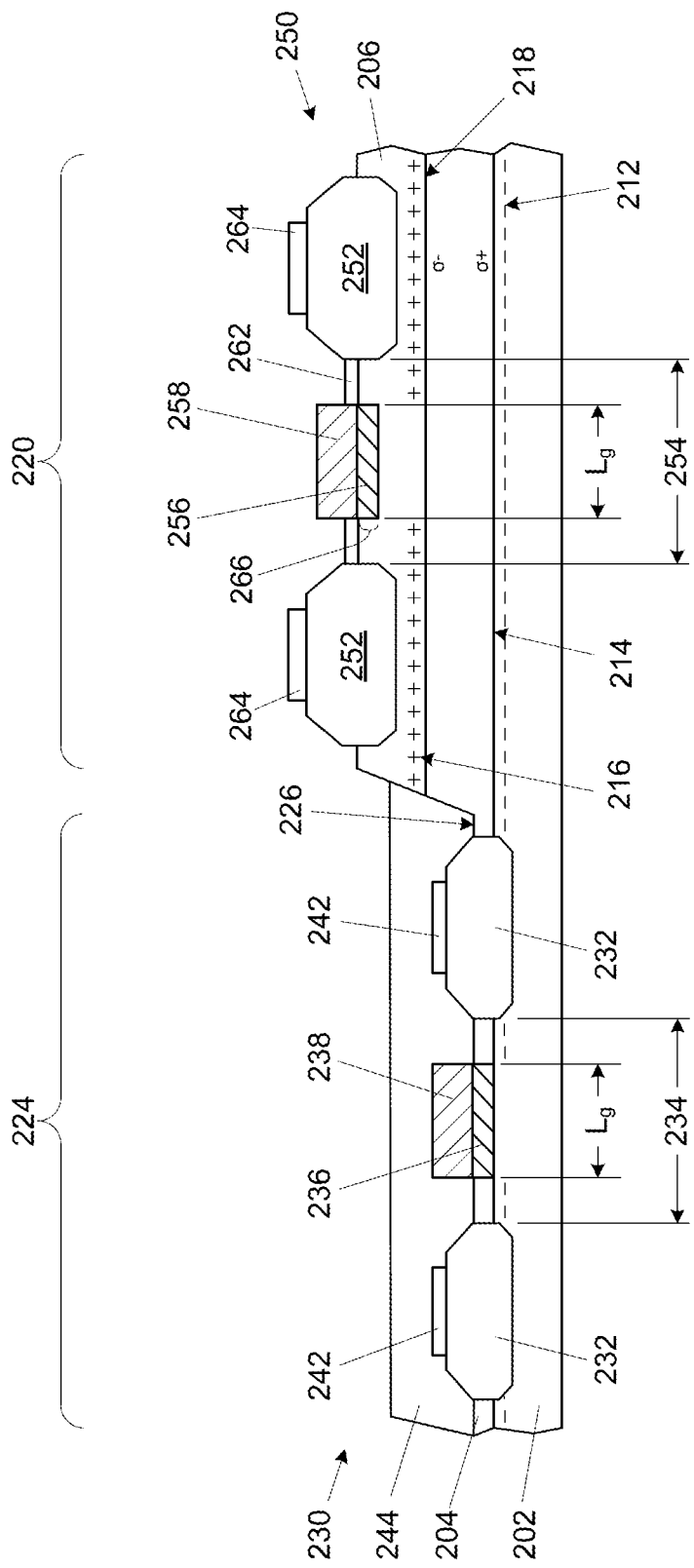

As illustrated in FIG. 8, an p-channel gallium nitride transistor 250 may be formed in the portion 226 after a second hardmask 228 (see FIG. 5) has removed and a third hardmask 244 is patterned over the n-channel gallium nitride transistor 230. The p-channel gallium nitride transistor 250 may comprise opposing source/drain structures 252 (one being a source structure and the other being a drain structure) with a gate region 254 defined therebetween and a p-doped gallium nitride layer 262 may be optionally formed over the gate region 254 to improve access resistance, as will be understood to those skilled in the art. A gate dielectric 256 may be formed in the gate region 254 and a gate electrode 258 may be formed on the gate dielectric 256 such that the gate dielectric 256 electrically isolates the gate electrode 258. In one embodiment, the p-channel gallium nitride transistor 250 is an enhancement mode transistor. Thus, as shown, a portion of the p-doped gallium nitride layer 262 may be removed (if present) and a recess 266 may be formed in the second gallium nitride layer 206, such that the gate dielectric 256 may be at least partially embedded in the second gallium nitride layer 206. As will be understood to those skilled in the art, the formation of the recess 266 and embedding the gate dielectric 256 may disrupt a portion of the 2D hole gas 216, such that it does not extend through the gate length $L_g$ of the p-channel gallium nitride transistor 250 to achieve enhancement mode operation. Furthermore, at least partially embedding the gate dielectric 256 may place the gate dielectric 256 and gate electronic 258 closer to the 2D hole gas 216 to enable a thin equivalent gate dielectric thickness for greater drive and electrostatics control, as will be understood to those skilled in the art.

In one embodiment, the source/drain structures 252 may be formed by forming by patterning a hardmask (not shown), such as silicon nitride, silicon oxide, and the like, on the polarization layer intermediate surface and recesses (not shown) may be formed to extend into the second gallium nitride layer 206, by any known technique, such as etching. In one embodiment, the recesses (not shown) may be formed with a plasma etch in a chlorine based chemistry. The source/drain structures 252, such as comprising P+ indium gallium nitride, P+ gallium nitride, P+ indium nitride, and any graded combination thereof, may be formed in the recesses (not shown) by epitaxial regrowth from the second gallium nitride layer 206. In one embodiment, the regrowth process may comprise epitaxial crystal growth techniques, such as metal organic chemical vapor deposition (MOCVD) or molecular beam epitaxy (MBE). The regrowth of the source/drain structures 252 for the p-channel gallium nitride transistor 250 may induce a uniaxial compressive strain which may improve hole mobility and improve contact resistance. After the formation of the source/drain structures 252, metallizations 264 may be formed on the source/drain structures 252.

The gate dielectric 256 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate. The gate dielectric 256 can be formed by well-known techniques, such as chemical vapor deposition ("CVD"), physical vapor deposition ("PVD"), and atomic layer deposition ("ALD"). The gate electrode 258 can be formed of any suitable gate electrode material. In an embodiment of the present disclosure, the gate electrode 258 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 258 can be formed by well-known techniques, such as by blanket depositing a gate electrode material and then patterning the gate electrode material with well-known photolithography and etching techniques, as will be understood to those skilled in the art.

Figure 9:
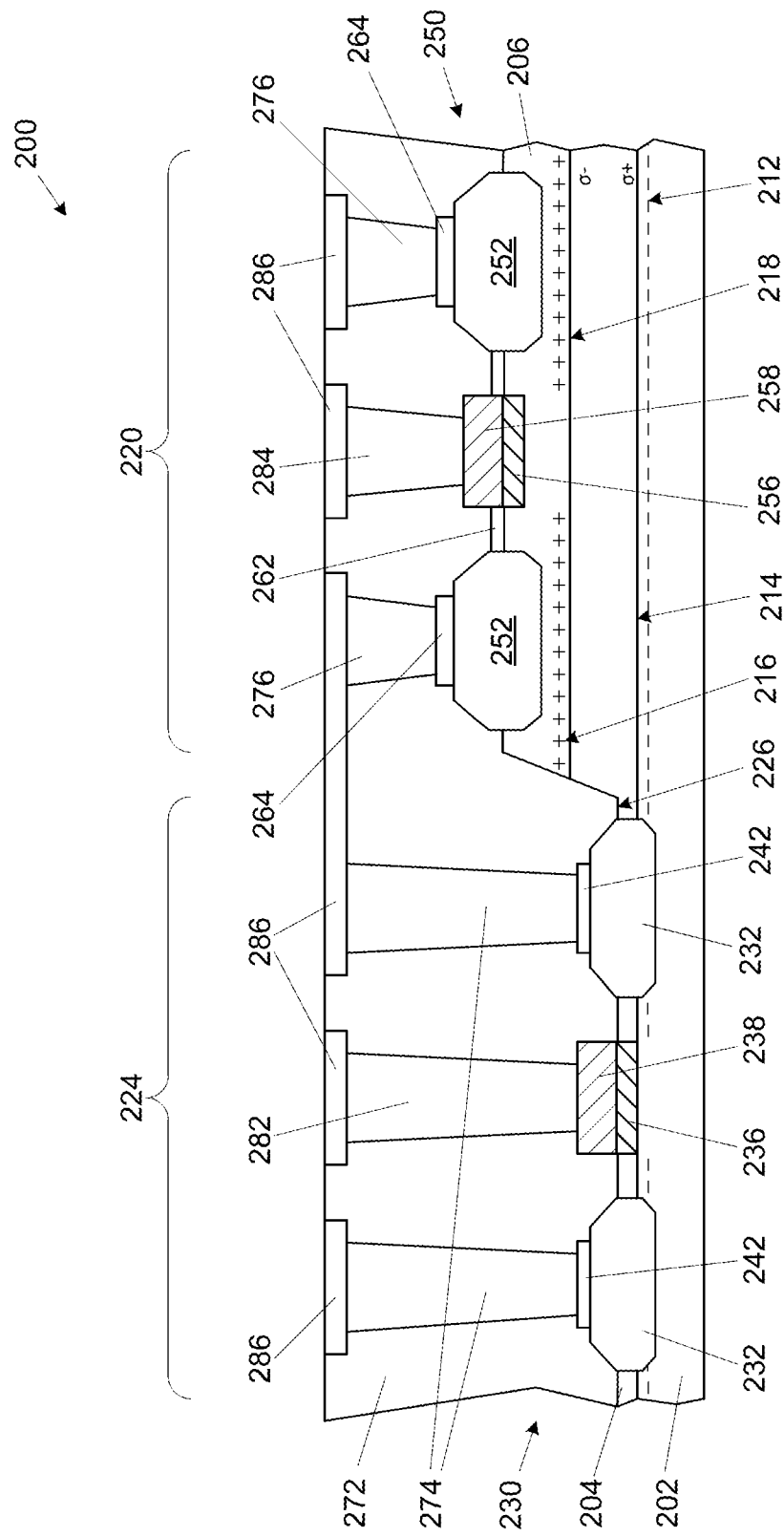

As shown in FIG. 9, the third hardmask 244 (see FIG. 8) may be removed and at least one interlayer dielectric layer 272 may be deposited over the n-channel gallium nitride transistor 230 and the p-channel gallium nitride transistor 250. N-channel source/drain contacts 274 may be formed through the interlayer dielectric layer 272 to contact the metalizations 242 of the n-channel gallium nitride transistor source/drain structures 232 and p-channel source/drain contacts 276 may be formed through the interlayer dielectric layer 272 to contact the metalizations 264 of the p-channel gallium nitride transistor source/drain structures 252. An n-channel transistor gate contact 282 may be formed through the interlayer dielectric layer 272 to contact the gate electrode 236 and a p-channel transistor gate contact 284 may be formed through the interlayer dielectric layer 272 to contact the gate electrode 256. As further shown in FIG. 9, conductive traces 286 may be formed to appropriately connect components of the n-channel gallium nitride transistor 230 and the p-channel gallium nitride transistor 250, as will be understood to those skilled in the art, thereby forming the CMOS gallium nitride circuit structure 200. The materials and processes used for forming the interlayer dielectric layer 272, the n-channel source/drain contacts 274, the p-channel source/drain contacts 276, the n-channel transistor gate contact 282, the p-channel transistor gate contact 284, and the conductive traces 286 are well known to those skilled in the art, and for the sake of brevity and conciseness will not be described or illustrated herein.

As will be understood to those skilled in the art, in order to minimize interconnect losses, and achieve smaller footprint, as well as other scaling advantages known in the art, the n-channel gallium nitride transistor 230 and the p-channel gallium nitride transistor 250 should be in close proximity to one another. In one embodiment, the n-channel gallium nitride transistor 230 and the p-channel gallium nitride transistor 250 may be separated by a single gate pitch; for example, less than about 100 nm.

It is understood that the components of the n-channel gallium nitride transistor 230 and the p-channel gallium nitride transistor 250 need not be fabricated separately, rather the steps of masking, unmasking, and re-masking may be undertaken to simultaneously form components for both the n-channel gallium nitride transistor 230 and the p-channel gallium nitride transistor 250, including, but not limited to, the gate dielectrics 236/256, the gate electrodes 238/258, and the like, depending on process demands, such as temperature.

Figure 10:
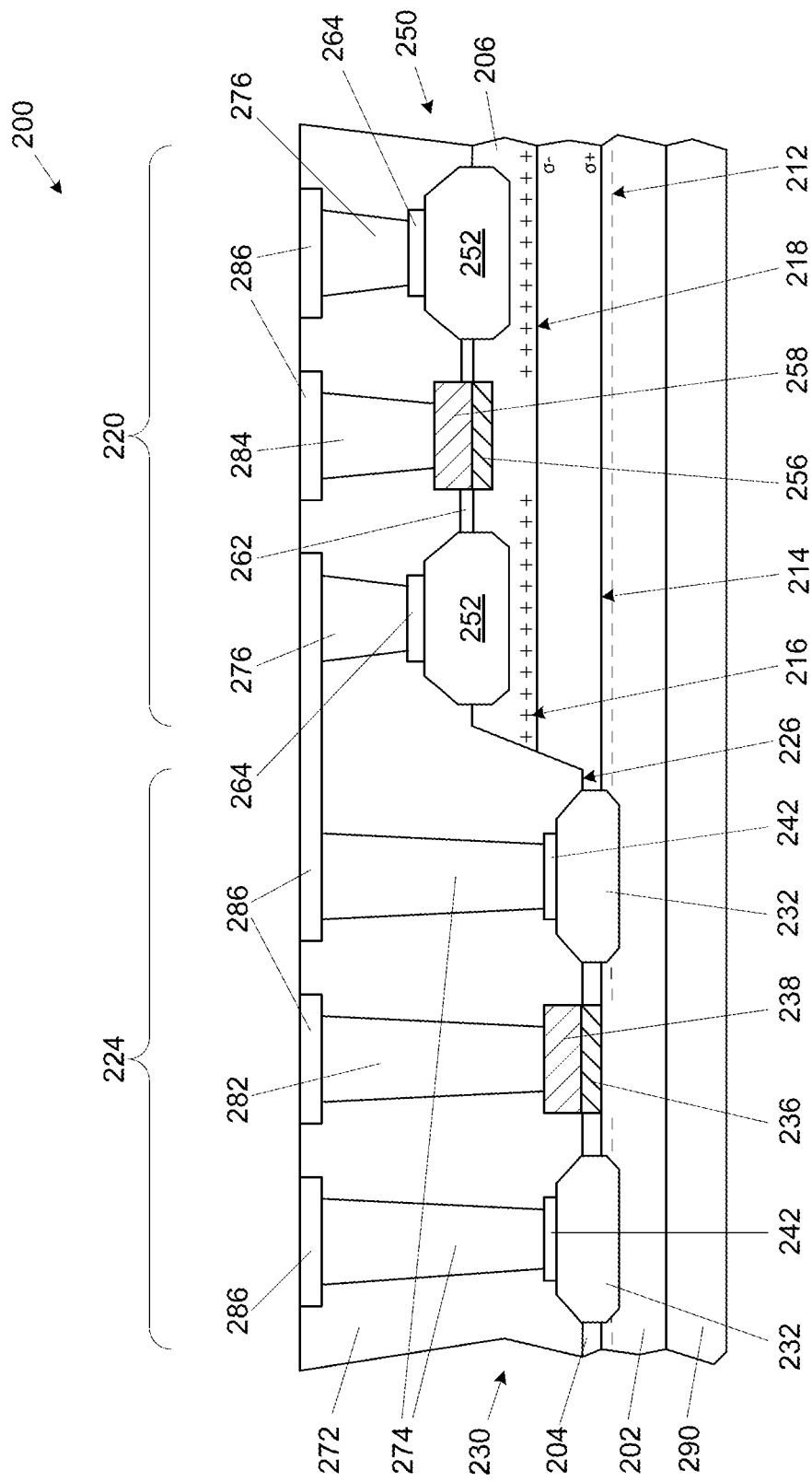
FIG. 10 is a side cross-section view of a gallium nitride circuit structure, according to another embodiment of the present description.

As shown in FIG. 10, in another embodiment of the present description, the first gallium nitride layer 202 may be formed on a strain material layer 290 having a lattice structure smaller than that of the first gallium nitride layer 202, which may induce a biaxial compressive strain to improve the mobility of the 2D hole gas 216 mobility. The strain material layer 290 may include, but is not limited to, aluminum nitride, aluminum indium nitride, aluminum gallium nitride, and the like.

Figure 11:
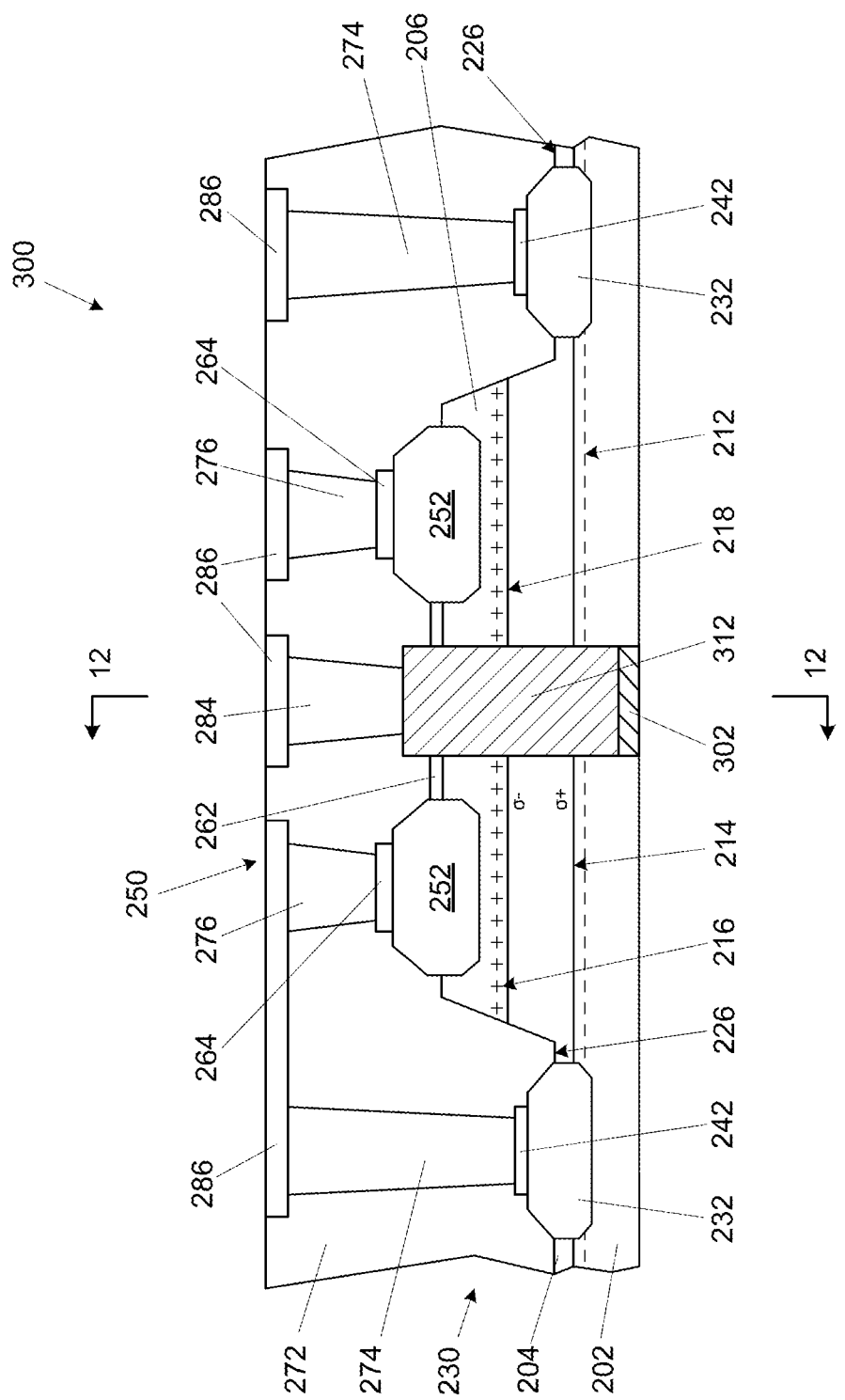
FIGS. 11 and 12 are side cross-section views of a gallium nitride circuit structure, according to still another embodiment of the present description.
Figure 12:
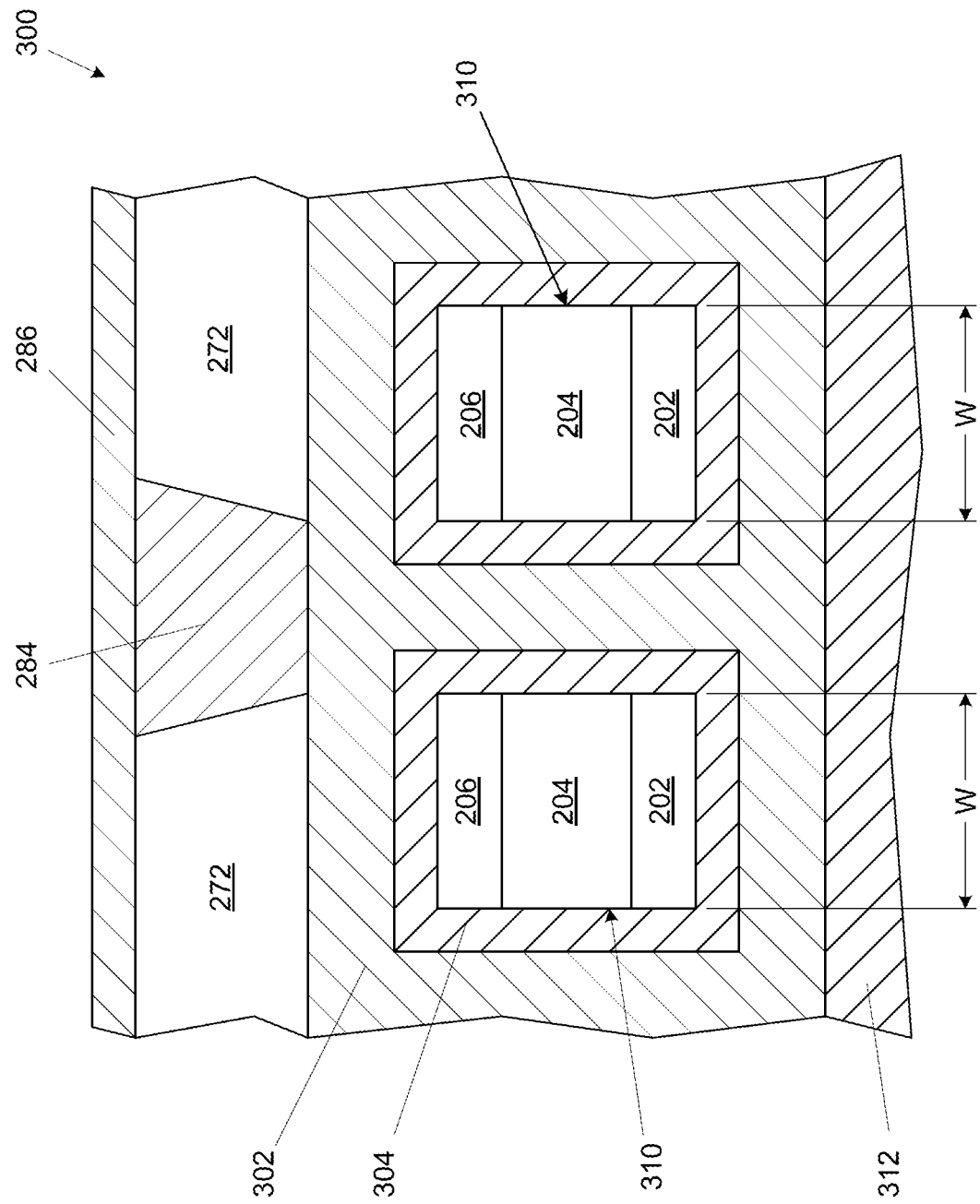

In another embodiment of the present description, as shown in FIG. 11, the p-channel gallium nitride transistor 250 may be stacked on top of the n-channel gallium nitride transistor 230, so that a common gate 302 could be shared to form a stacked CMOS gallium nitride circuit structure 300. The stacked CMOS gallium nitride circuit structure 300 may have tighter scale integration than the CMOS gallium nitride circuit structure 200 embodiments shown in FIGS. 3-10. As shown in FIG. 12, which is a cross-sectional view along line 12-12 of FIG. 11, the common gate 302 may comprise a gate dielectric 304 surrounding at least one stack 310 comprising the first gallium nitride layer 202, the second gallium nitride layer 206, and the polarization layer 204 therebetween, and a gate electrode 306 surrounding the gate dielectric 304. An under-fill dielectric 312 may be disposed below the common gate 302 for electrical isolation thereof. In one embodiment, the efficiency of the depletion the 2D electron gas 212 (see FIG. 11) and the 2D hole gas 216 (see FIG. 11) may be improved by reducing the width W of the stack 310 to less than about 20 nm. Thus, as shown, more than one stack 310 may be fabricated for each CMOS gallium nitride circuit structure 300 to achieve efficient operation thereof. The materials and processes used for forming the CMOS gallium nitride circuit structure 300 illustrated in FIGS. 11 and 12 are well known to those skilled in the art, and for the sake of brevity and conciseness will not be described or illustrated herein.

Figure 13:
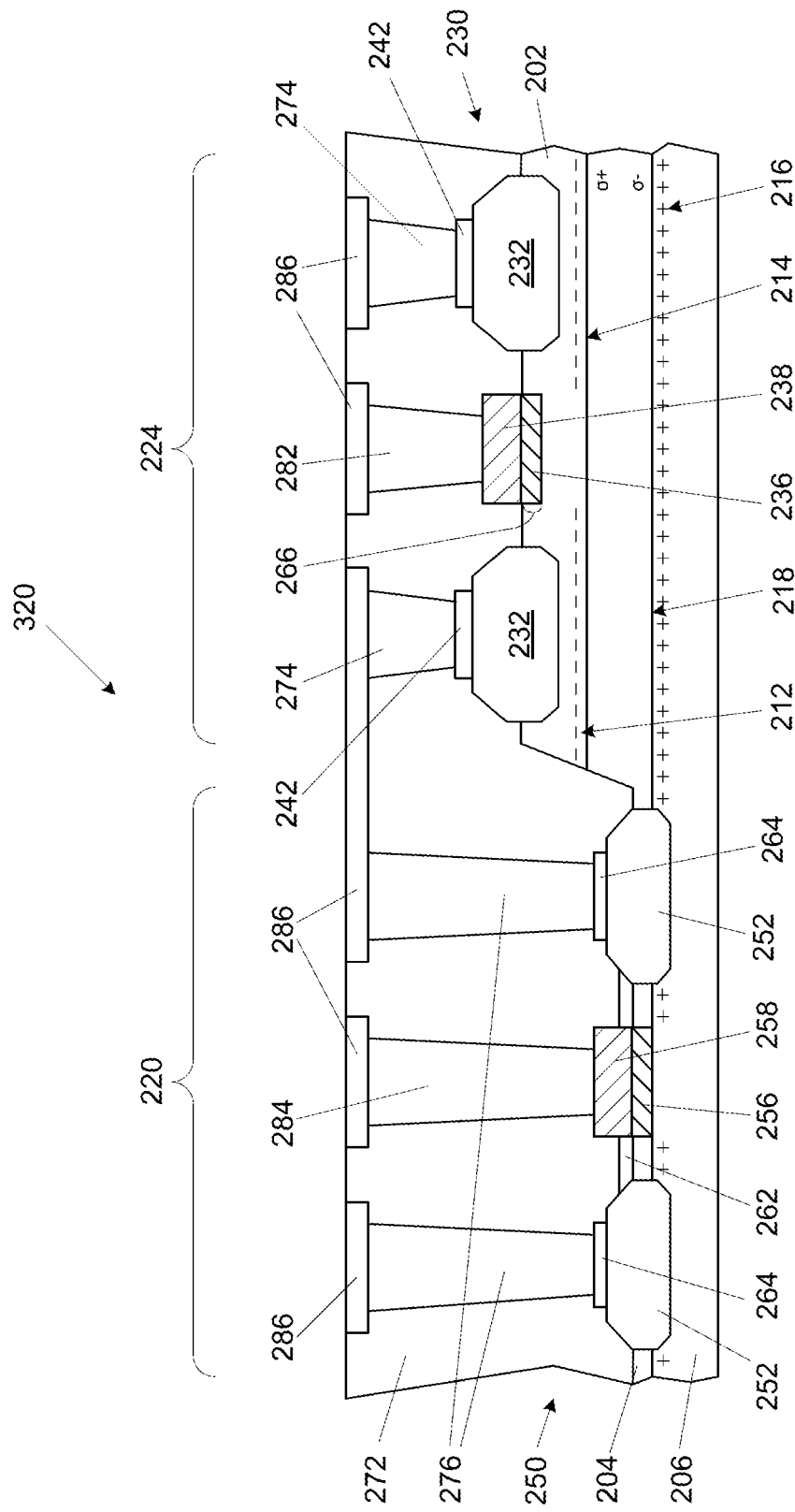
FIG. 13 is a side cross-section view of a gallium nitride circuit structure, according to a further embodiment of the present description.
Figure 14:
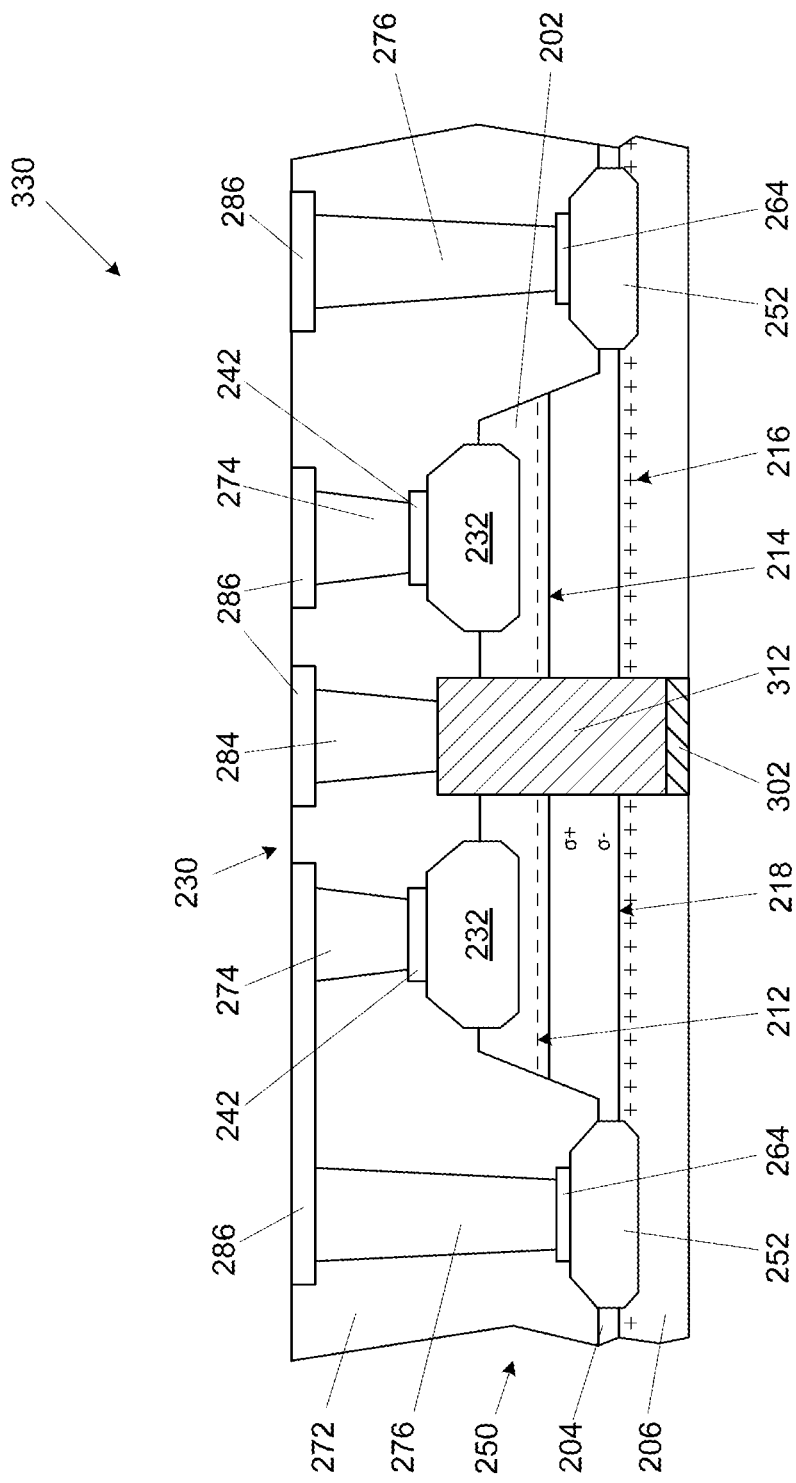
FIG. 14 is a side cross-section view of a gallium nitride circuit structure, according to another embodiment of the present description.

In another embodiment, the layered structure 210 of FIG. 3 may be flipped and fabrication of the n-channel gallium nitride transistor components and the p-channel gallium nitride transistor components reversed to form the CMOS gallium nitride circuit structure 320 of FIG. 13 or the CMOS gallium nitride circuit structure 330 of FIG. 14.

As will be understood to those skilled in the art, embodiments of the present description may not only be relevant to all system-on-chip products, such as those that will require direct battery high voltage switching transistors such as for DC-to-DC conversion, but may also be applicable in the fabrication of control and drive circuitries, as well as logic peripheries, e.g. microprocessors, static random access memory, and communication processors.

Figure 15:
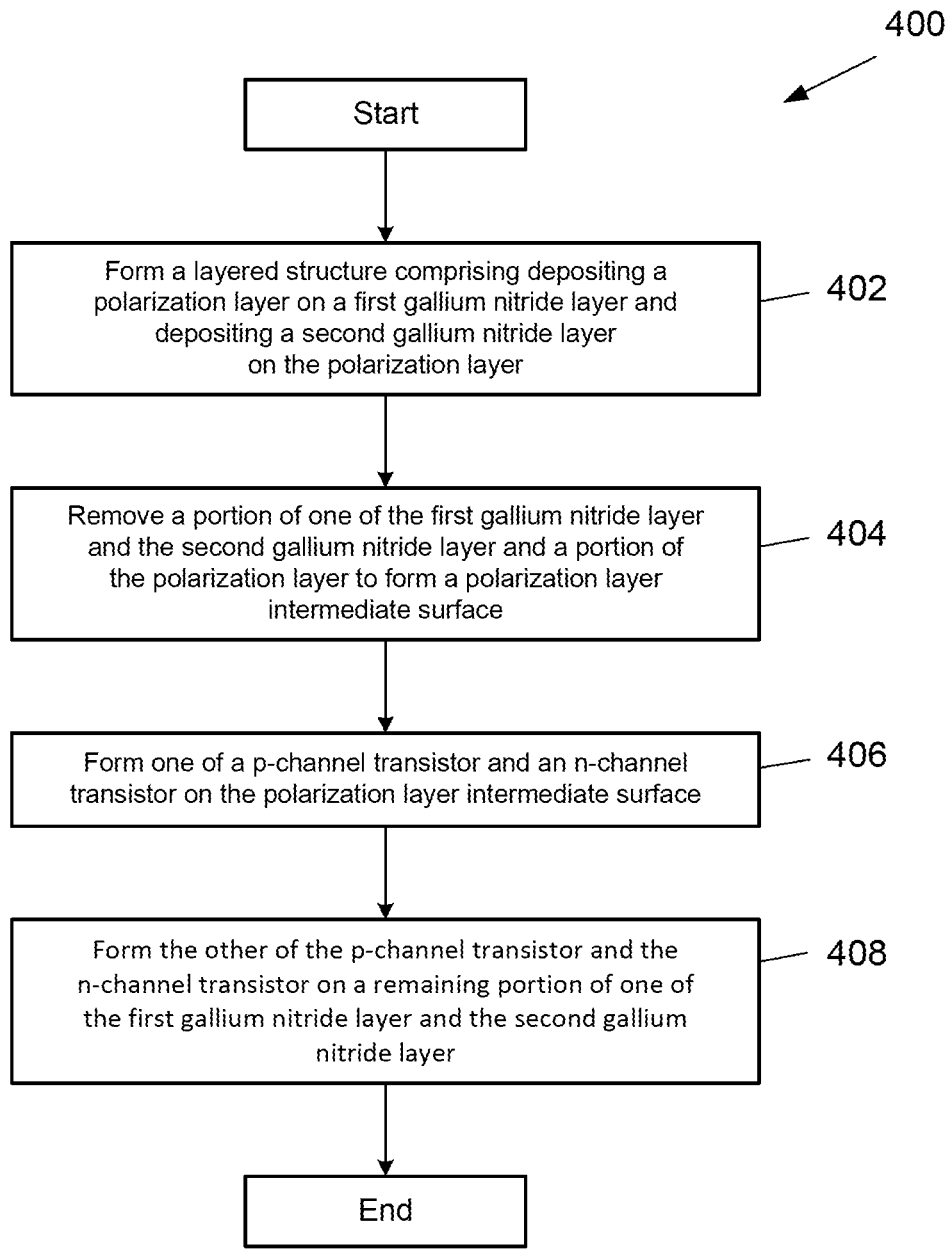
FIG. 15 is a flow chart of a process of fabricating a gallium nitride circuit structure, according to an embodiment of the present description.

FIG. 15 is a flow chart of a process 400 of fabricating a CMOS circuit structure according to an embodiment of the present description. As set forth in block 402, a layer structure may be formed by depositing a polarization layer on a first gallium nitride layer and depositing a second gallium nitride layer on the polarization layer. A portion of one of the first gallium nitride layer and the second gallium nitride layer and a portion of the polarization layer may be removed to form a polarization layer intermediate surface, as set forth in block 404. As set forth in block 406, one of a p-channel transistor and an n-channel transistor may be formed on the polarization intermediate surface. The other of the p-channel transistor and the n-channel transistor may be formed on the remaining portion of one of the the first gallium nitride layer and the second gallium nitride layer, as set forth in block 408.

Figure 16:
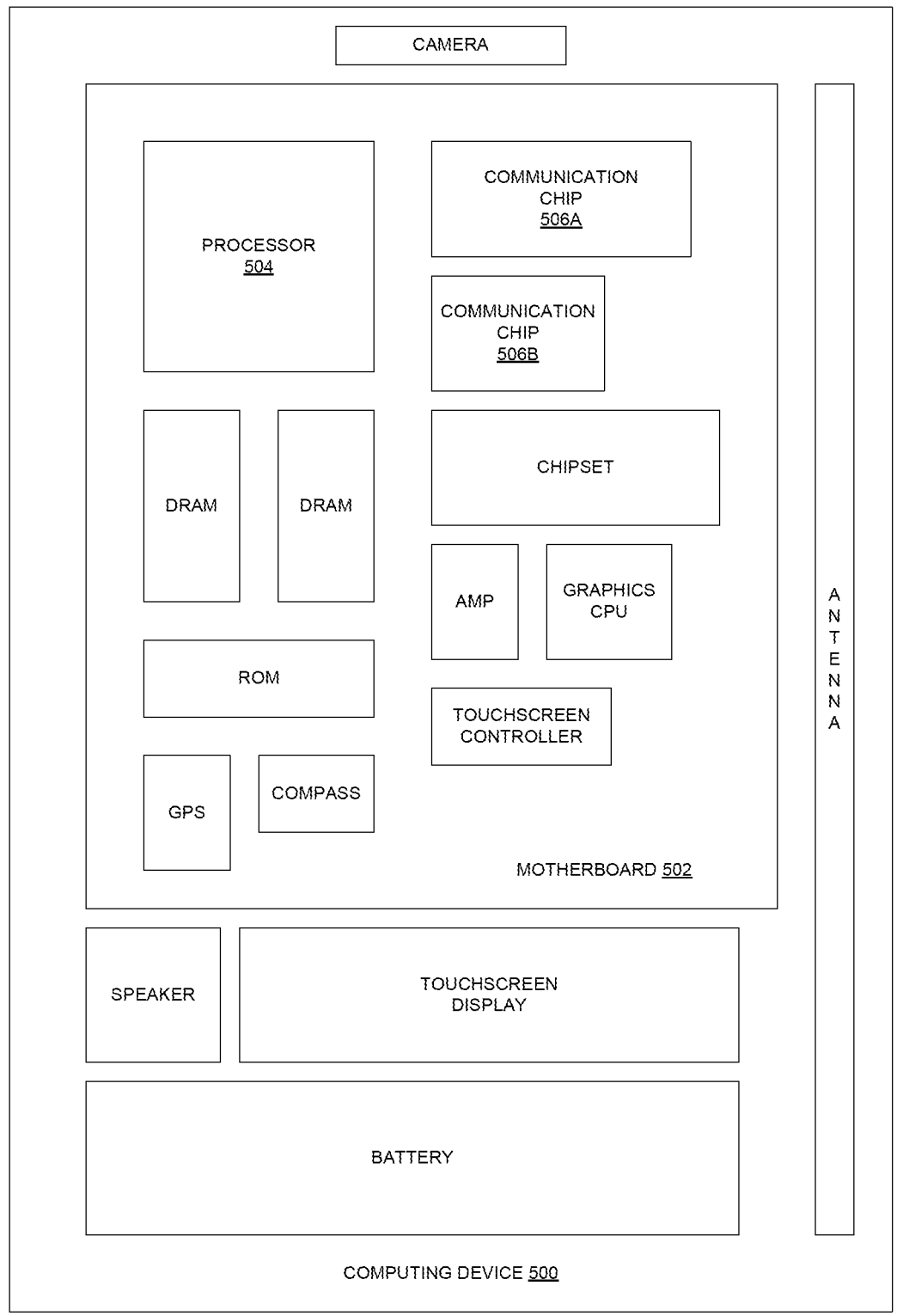
FIG. 16 illustrates a computing device in accordance with one implementation of the present description.

FIG. 16 illustrates a computing device 500 in accordance with one implementation of the present description. The computing device 500 houses a board 502. The board 502 may include a number of components, including but not limited to a processor 504 and at least one communication chip 506A, 506B. The processor 504 is physically and electrically coupled to the board 502. In some implementations the at least one communication chip 506A, 506B is also physically and electrically coupled to the board 502. In further implementations, the communication chip 506A, 506B is part of the processor 504.

Depending on its applications, the computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506A, 506B enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 306A, 306B. For instance, a first communication chip 506A may be dedicated to shorter range wireless communications such as Wi-Fi and Bluetooth and a second communication chip 506B may be dedicated to longer range wireless communications such as GPS, EDGE, GPRS, CDMA, WiMAX, LTE, Ev-DO, and others.

The processor 504 of the computing device 500 may include CMOS circuits formed from p-channel gallium nitride transistors and n-channel gallium nitride transistors, as described above. The term "processor" may refer to any device or portion of a device that processes electronic data from registers and/or memory to transform that electronic data into other electronic data that may be stored in registers and/or memory. Furthermore, the communication chip 506A, 506B may include CMOS circuits formed from p-channel gallium nitride transistors and n-channel gallium nitride transistors.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-16. The subject matter may be applied to other microelectronic device and assembly applications, as well as any other appropriate transistor applications, as will be understood to those skilled in the art.

The following examples pertain to further embodiments, wherein Example 1 is a CMOS circuit structure comprising a layered structure including a first gallium nitride layer and a second gallium nitride layer separated by a polarization layer, wherein the layered structure includes an polarization layer intermediate surface; one of a p-channel transistor and an n-channel transistor formed proximate the polarization layer intermediate surface; and the other of the p-channel transistor and an n-channel transistor formed on one of the first gallium nitride layer and the second gallium nitride layer.

In Example 2, the subject matter of Example 1 can optionally include the p-channel transistor being an enhancement mode transistor.

In Example 3, the subject matter of any of Examples 1 and 2 can optionally include the n-channel transistor being an enhancement mode transistor.

In Example 4, the subject matter of any of Examples 1 to 3 can optionally include the polarization layer being selected from the group consisting of aluminum gallium nitride, aluminum indium nitride, indium gallium nitride, aluminum nitride, and aluminum gallium nitride.

In Example 5, the subject matter of any of Examples 1 to 4 can optionally include a strain material layer, wherein the first gallium nitride layer abuts the strain material layer.

In Example 6, the subject matter of Example 5 can optionally include the strain material layer being selected from the group consisting of aluminum nitride, aluminum indium nitride, aluminum gallium nitride, and aluminum indium gallium nitride.

In Example 7, the subject matter of any of Example 1 to 6 can optionally include the layered structure including a 2D electron gas within the first gallium nitride layer proximate the polarization layer and a 2D hole gas within the second gallium nitride layer; and wherein the n-channel transistor is formed proximate the polarization layer intermediate surface and the p-channel transistor is formed proximate the second gallium nitride layer.

In Example 8, the subject matter of Example 7 can optionally include a recess in the second gallium nitride layer disrupting a portion of the 2D hole gas.

In Example 9, the subject matter of any of Examples 1 to 6 can optionally include the layered structure including a 2D electron gas within the first gallium nitride layer proximate the polarization layer and a 2D hole gas within the second gallium nitride layer; and wherein the p-channel transistor is formed proximate the polarization layer intermediate surface and the n-channel transistor is formed proximate the first gallium nitride layer.

In Example 10, the subject matter of Example 9 can optionally include a recess in the first gallium nitride layer disrupting a portion of the 2D electron gas.

The following examples pertain to further embodiments, wherein Example 11 is a method of fabricating a CMOS circuit structure comprising forming a layered structure comprising depositing a polarization layer on a first gallium nitride layer and depositing a second gallium nitride layer on the polarization layer; removing a portion of one of the first gallium nitride layer and the second gallium nitride layer and a portion of the polarization layer to form a polarization layer intermediate surface; forming one of a p-channel transistor and an n-channel transistor on the polarization layer intermediate surface; and forming the other of the p-channel transistor and the n-channel transistor on a remaining portion of one of the first gallium nitride layer and the second gallium nitride layer.

In Example 12, the subject matter of Example 11 can optionally include forming the p-channel transistor comprising forming a p-channel enhancement mode transistor.

In Example 13, the subject matter of any of Examples 11 to 12 can optionally include forming the n-channel transistor comprising forming an n-channel enhancement mode transistor.

In Example 14, the subject matter of any of Examples 11 to 13 can optionally include depositing the polarization layer comprising depositing a material selected from the group consisting of aluminum gallium nitride, aluminum indium nitride, indium gallium nitride, aluminum nitride, and aluminum indium gallium nitride.

In Example 15, the subject matter of any of Examples 11 to 14 can optionally include depositing the first gallium nitride layer on a strain material layer.

In Example 16, the subject matter of Example 15 can optionally include the strain material layer being selected from the group consisting of aluminum nitride, aluminum indium nitride, aluminum gallium nitride, and aluminum indium gallium nitride.

In Example 17, the subject matter of any of Example 11 to 16 can optionally include forming the layered structure comprising forming a 2D electron gas within the first gallium nitride layer proximate the polarization layer and forming a 2D hole gas within the second gallium nitride layer; and wherein the n-channel transistor is formed proximate the polarization layer intermediate surface and the p-channel transistor is formed proximate the second gallium nitride layer.

In Example 18, the subject matter of Example 17 can optionally include forming a recess in the second gallium nitride layer to disrupt a portion of the 2D hole gas.

In Example 19, the subject matter of Example 11 to 16 can optionally include forming the layered structure includes forming a 2D electron gas within the first gallium nitride layer proximate the polarization layer and forming a 2D hole gas within the second gallium nitride layer; and wherein the p-channel transistor is formed proximate the polarization layer intermediate surface and the n-channel transistor is formed proximate the first gallium nitride layer.

In Example 20, the subject matter of Example 19 can optionally include forming a recess in the first gallium nitride layer to disrupt a portion of the 2D electron gas.

The following examples pertain to further embodiments, wherein Example 21 is an electronic system, comprising a board and a microelectronic device attached to the board, wherein the microelectronic device includes at least one CMOS circuit structure comprising a layered structure including a first gallium nitride layer and a second gallium nitride layer separated by a polarization layer, wherein the layered structure includes an polarization layer intermediate surface; one of a p-channel transistor and an n-channel transistor formed proximate the polarization layer intermediate surface; and the other of the p-channel transistor and an n-channel transistor formed on one of the first gallium nitride layer and the second gallium nitride layer.

In Example 22, the subject matter of Example 21 can optionally include the layered structure including a 2D electron gas within the first gallium nitride layer proximate the polarization layer and a 2D hole gas within the second gallium nitride layer; and wherein the n-channel transistor is formed proximate the polarization layer intermediate surface and the p-channel transistor is formed proximate the second gallium nitride layer.

In Example 23, the subject matter of Example 22 can optionally include a recess in the second gallium nitride layer disrupting a portion of the 2D hole gas.

In Example 24, the subject matter of Example 21 can optionally the layered structure including a 2D electron gas within the first gallium nitride layer proximate the polarization layer and a 2D hole gas within the second gallium nitride layer; and wherein the p-channel transistor is formed proximate the polarization layer intermediate surface and the n-channel transistor is formed proximate the first gallium nitride layer.

In Example 25, the subject matter of Example 24 can optionally include a recess in the first gallium nitride layer disrupting a portion of the 2D electron gas.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A CMOS circuit structure comprising:
    a layered structure including a first gallium nitride layer and a second gallium nitride layer separated by a polarization layer, wherein the layered structure includes an polarization layer intermediate surface and wherein a thickness between the polarization layer intermediate surface and an interface between the first gallium nitride layer and the polarization layer is less than about 20 nm;
    a first transistor formed proximate the polarization layer intermediate surface, wherein the first transistor includes at least one source/drain structure extending through a portion of the polarization layer and into the first gallium nitride layer, and wherein the first transistor includes a gate dielectric and a gate electrode, wherein the gate dielectric contacts the first gallium nitride layer and the polarization layer, and wherein the first transistor is one of a p-channel transistor and a n-channel transistor; and
    a second the second gallium nitride layer, wherein the first transistor includes at least one source/drain structure extending into the second gallium nitride layer, wherein the second transistor includes a gate dielectric and a gate electrode, wherein the gate dielectric contacts the second gallium nitride, and wherein the second transistor is one of a p-channel transistor and a n-channel transistor differing from the first transistor.

2. The CMOS circuit structure of claim 1, wherein the p-channel transistor is an enhancement mode transistor.

3. The CMOS circuit structure of claim 1, wherein the n-channel transistor is an enhancement mode transistor.

4. The CMOS circuit structure of claim 1, wherein the polarization layer is selected from the group consisting of aluminum gallium nitride, aluminum indium nitride, indium gallium nitride, aluminum nitride, and aluminum indium gallium nitride.

5. The CMOS circuit structure of claim 1, further including a strain material layer, wherein the first gallium nitride layer abuts the strain material layer.

6. The CMOS circuit structure of claim 5, wherein the strain material layer is selected from the group consisting of aluminum nitride, aluminum indium nitride, aluminum gallium nitride, and aluminum indium gallium nitride.

7. The CMOS circuit structure of claim 1, wherein the layered structure includes a 2D electron gas within the first gallium nitride layer proximate the polarization layer and a 2D hole gas within the second gallium nitride layer; and wherein the n-channel transistor is formed proximate the polarization layer intermediate surface and the p-channel transistor is formed proximate the second gallium nitride layer.

8. The CMOS circuit structure of claim 7, further including a recess in the second gallium nitride layer disrupting a portion of the 2D hole gas.

9. The CMOS circuit structure of claim 1, wherein the layered structure includes a 2D electron gas within the first gallium nitride layer proximate the polarization layer and a 2D hole gas within the second gallium nitride layer; and wherein the p-channel transistor is formed proximate the polarization layer intermediate surface and the n-channel transistor is formed proximate the first gallium nitride layer.

10. The CMOS circuit structure of claim 9, further including a recess in the first gallium nitride layer disrupting a portion of the 2D electron gas.

11. A method of fabricating a CMOS circuit structure comprising:
    forming a layered structure comprising depositing a polarization layer on a first gallium nitride layer and depositing a second gallium nitride layer on the polarization layer;
    removing a portion of one of the first gallium nitride layer and the second gallium nitride layer and a portion of the polarization layer to form a polarization layer intermediate surface and wherein a thickness between the polarization layer intermediate surface and an interface between the first gallium nitride layer and the polarization layer is less than about 20 nm;

forming a first transistor on the polarization layer intermediate surface, wherein the first transistor includes at least one source/drain structure extending through a portion of the polarization layer and into the first gallium nitride layer, and wherein the first transistor includes a gate dielectric and a gate electrode, wherein the gate dielectric contacts the first gallium nitride layer and the polarization layer, and wherein the first transistor is one of a p-channel transistor and a n-channel transistor; and forming a second the second gallium nitride layer, wherein the first transistor includes at least one source/drain structure extending into the second gallium nitride layer, wherein the second transistor includes a gate dielectric and a gate electrode, wherein the gate dielectric contacts the second gallium nitride, and wherein the second transistor is one of a p-channel transistor and a n-channel transistor differing from the first transistor.

12. The method of claim 11, wherein forming the p-channel transistor comprises forming a p-channel enhancement mode transistor.

13. The method of claim 11, wherein forming the n-channel transistor comprises forming an n-channel enhancement mode transistor.

14. The method of claim 11, wherein depositing the polarization layer comprises depositing a material selected from the group consisting of aluminum gallium nitride, aluminum indium nitride, indium gallium nitride, aluminum nitride, and aluminum indium gallium nitride.

15. The method of claim 11, further comprising depositing the first gallium nitride layer on a strain material layer.

16. The method of claim 15, wherein the strain material layer is selected from the group consisting of aluminum nitride, aluminum indium nitride, aluminum gallium nitride, and aluminum indium gallium nitride.

17. The method of claim 11, wherein forming the layered structure includes forming a 2D electron gas within the first gallium nitride layer proximate the polarization layer and forming a 2D hole gas within the second gallium nitride layer; and wherein the n-channel transistor is formed proximate the polarization layer intermediate surface and the p-channel transistor is formed proximate the second gallium nitride layer.

18. The method of claim 17, further including forming a recess in the second gallium nitride layer to disrupt a portion of the 2D hole gas.

19. The method of claim 11, wherein forming the layered structure includes forming a 2D electron gas within the first gallium nitride layer proximate the polarization layer and forming a 2D hole gas within the second gallium nitride layer; and wherein the p-channel transistor is formed proximate the polarization layer intermediate surface and the n-channel transistor is formed proximate the first gallium nitride layer.

20. The method of claim 19, further including forming a recess in the first gallium nitride layer to disrupt a portion of the 2D electron gas.

21. An electronic system, comprising:
a board; and
a microelectronic device attached to the board, wherein the microelectronic device includes at least one CMOS circuit structure comprising:
a layered structure including a first gallium nitride layer and a second gallium nitride layer separated by a polarization layer, wherein the layered structure includes an polarization layer intermediate surface and wherein a thickness between the polarization layer intermediate surface and an interface between the first gallium nitride layer and the polarization layer is less than about 20 nm;
a first transistor formed proximate the polarization layer intermediate surface, wherein the first transistor includes at least one source/drain structure extending through a portion of the polarization layer and into the first gallium nitride layer, and wherein the first transistor includes a gate dielectric and a gate electrode, wherein the gate dielectric contacts the first gallium nitride layer and the polarization layer, and wherein the first transistor is one of a p-channel transistor and a n-channel transistor; and
a second transistor formed on the second gallium nitride layer, wherein the first transistor includes at least one source/drain structure extending into the second gallium nitride layer, wherein the second transistor includes a gate dielectric and a gate electrode, wherein the gate dielectric contacts the second gallium nitride, and wherein the second transistor is one of a p-channel transistor and a n-channel transistor differing from the first transistor.

22. The electronic system of claim 21, wherein the layered structure includes a 2D electron gas within the first gallium nitride layer proximate the polarization layer and a 2D hole gas within the second gallium nitride layer; and wherein the n-channel transistor is formed proximate the polarization layer intermediate surface and the p-channel transistor is formed proximate the second gallium nitride layer.

23. The electronic system of claim 22, further including a recess in the second gallium nitride layer disrupting a portion of the 2D hole gas.

24. The electronic system of claim 21, wherein the layered structure includes a 2D electron gas within the first gallium nitride layer proximate the polarization layer and a 2D hole gas within the second gallium nitride layer; and wherein the p-channel transistor is formed proximate the polarization layer intermediate surface and the n-channel transistor is formed proximate the first gallium nitride layer.

25. The electronic system of claim 24, further including a recess in the first gallium nitride layer disrupting a portion of the 2D electron gas.

* * * * *